(12) United States Patent
Park et al.

(10) Patent No.: US 8,362,598 B2
(45) Date of Patent: Jan. 29, 2013

(54) SEMICONDUCTOR DEVICE WITH ELECTROMAGNETIC INTERFERENCE SHIELDING

(76) Inventors: Sung Sun Park, Gwangjin-gu (KR); Ik Su Jun, Gwanak-gu (KR); Ye Sul Ahn, Songpa-gu (KR)

( * ) Notice: Subject to any disclaimer, the term of this patent is extended or adjusted under 35 U.S.C. 154(b) by 646 days.

(21) Appl. No.: 12/548,354

(22) Filed: Aug. 26, 2009

(65) Prior Publication Data
US 2011/0049685 A1 Mar. 3, 2011

(51) Int. Cl.
*H01L 23/552* (2006.01)

(52) U.S. Cl. ........ 257/660; 257/690; 257/704; 257/672; 257/670; 257/784; 438/112; 438/123

(58) Field of Classification Search .................. 257/660, 257/690, 666, 669, 670, 671, 672, 674, 675, 257/676, 677, 678, 778, 692, 693, 694, 696, 257/706, 707, 734, 779, 780, 781, 782, 783, 257/784, 786, 787, 788, 704, 712, 790, 796; 438/106, 108, 112, 123, 126, 127
See application file for complete search history.

(56) References Cited

U.S. PATENT DOCUMENTS

| | | | |
|---|---|---|---|
| 4,925,024 A | 5/1990 | Ellenberger et al. | |
| 5,166,772 A | 11/1992 | Soldner et al. | |
| 5,416,358 A | 5/1995 | Ochi et al. | |
| 5,468,999 A | 11/1995 | Lin et al. | |
| 5,473,191 A | 12/1995 | Tanaka | |
| 5,490,271 A | 2/1996 | Elliott et al. | |
| 5,557,142 A | 9/1996 | Gilmore et al. | |
| 5,614,694 A | 3/1997 | Gorenz, Jr. | |
| 5,656,864 A | 8/1997 | Mitsue et al. | |
| 5,694,300 A | 12/1997 | Mattei et al. | |
| 5,907,271 A | 5/1999 | Hirano et al. | |
| 6,136,131 A | 10/2000 | Sosnowski | |
| 6,194,655 B1 | 2/2001 | Lange, Sr. et al. | |
| 6,246,115 B1 | 6/2001 | Tang et al. | |
| 6,423,570 B1 | 7/2002 | Ma et al. | |
| 6,433,420 B1 | 8/2002 | Yang et al. | |
| 6,465,280 B1 | 10/2002 | Martin et al. | |
| 6,602,737 B2 | 8/2003 | Wu | |
| 6,605,865 B2 | 8/2003 | Jeong et al. | |
| 6,639,989 B1 | 10/2003 | Zacharov et al. | |
| 6,686,649 B1 | 2/2004 | Mathews et al. | |
| 7,030,469 B2 | 4/2006 | Mahadevan et al. | |
| 7,741,158 B2 * | 6/2010 | Leung et al. ................ | 438/122 |
| 2002/0089833 A1 | 7/2002 | Patel et al. | |
| 2004/0136123 A1 * | 7/2004 | Nakamura et al. ........... | 361/35 |
| 2005/0280139 A1 | 12/2005 | Zhao et al. | |
| 2006/0067757 A1 | 3/2006 | Anderson et al. | |
| 2007/0030661 A1 | 2/2007 | Morris et al. | |
| 2008/0073772 A1 * | 3/2008 | Youn et al. .................... | 257/690 |
| 2009/0243058 A1 * | 10/2009 | Shirasaka .................... | 257/670 |

* cited by examiner

*Primary Examiner* — Ha Tran T Nguyen
*Assistant Examiner* — Thanh Y Tran

(57) ABSTRACT

In accordance with the present invention, there is provided a quad flat no leads (QFN) semiconductor device or package including a leadframe wherein the leads of the leadframe are selectively formed so that portions one or more prescribed leads are exposed in a package body of the semiconductor package and electrically connected to an electromagnetic interference (EMI) shielding layer applied to the package body. In certain embodiments of the present invention, one or more tie bars of the leadframe may also be formed so as to be exposed in the package body of the semiconductor package and electrically connected to the shielding layer applied to the package body. Thus, in the present invention, the shielding layer may be electrically connected to one or more leads alone or in combination with one or more tie bars of the leadframe.

20 Claims, 12 Drawing Sheets

SEMICONDUCTOR DEVICE WITH ELECTROMAGNETIC INTERFERENCE SHIELDING

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to semiconductor packages and, more particularly to a quad flat no leads (QFN) semiconductor device or package which includes one or more leads exposed in the package body of the semiconductor package in a manner making such lead(s) suitable for electrical connection to an electromagnetic interference (EMI) shielding layer of the semiconductor package.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package comprise a metal leadframe, an integrated circuit or semiconductor die, bonding material to attach the semiconductor die to the leadframe, bond wires which electrically connect pads or contacts on the semiconductor die to individual leads of the leadframe, and a hard plastic encapsulant material which covers the other components and forms the exterior of the semiconductor package, commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe may extend externally from the package body, or may be partially exposed therein for use in electrically connecting the semiconductor package to another component. In certain semiconductor packages, a portion of the die pad of the leadframe also remains exposed within the package body.

In an often used methodology for fabricating a plurality of the above-described semiconductor packages, a matrix of interconnected leadframes are etched into a leadframe strip. Subsequent to the attachment of the semiconductor dies to respective ones of the die pads of the leadframes and the electrical connection of the pads of the semiconductor dies to the leads of the corresponding leadframes, an encapsulation step facilitates the application of the encapsulant material onto the surface of the leadframe strip to which the semiconductor dies are attached. This encapsulation step covers the semiconductor dies, the side surfaces of the die pads, and portions of the leads within a single block of encapsulant material. The encapsulant material is then hardened, with a cutting step thereafter being used to separate individual semiconductor packages from each other and from the disposable portions of each of the leadframes within the leadframe strip. The cutting step severs the connection between each of the interconnected leadframes within the leadframe strip, and the die pad and leads of each individual leadframe. This cutting or "singulation" process is typically accomplished through either a sawing process (saw singulation) or a punching process (punch singulation). As indicated above, the formation of the individual leadframes within the leadframe strip is itself typically accomplished through either a chemical etching or mechanical stamping process.

One type of semiconductor package commonly including a leadframe is a quad flat no leads (QFN) package. QFN semiconductor packages or devices are particularly advantageous for their smaller size and superior electrical performance. A typical QFN package comprises a thin, generally square package body defining four peripheral sides of substantially equal length. Exposed in the bottom surface of the package body are portions of each of the leads, such exposed portions defining lands or terminals which are used to facilitate the electrical connection of the QFN package to an external device. The lands or terminals defined by the leads are typically segregated into four sets, with the terminals of each set extending along a respective one of the four peripheral sides of the package body. The semiconductor die is itself mounted to a die pad of the QFN package leadframe, with that surface of the die pad opposite to that which the semiconductor die is attached sometimes being exposed in that surface of the package body in which the terminals defined by the leads are also exposed. As indicated above, the pads or contacts of the semiconductor die are electrically connected to the leads, and typically the top surfaces of the leads which are opposite the bottom surfaces thereof defining the exposed terminals.

As the art has moved to smaller, lighter weight, and higher frequency electronic devices such as cellular telephones, semiconductor packages utilized in these electronic devices are increasingly placed closer to other electronic components and structures. Due to this reduced spacing, radiation such as electromagnetic or radio frequency (RF) radiation emanating from a semiconductor package has a greater probability of interfering with the normal operation of an adjacent electronic component, and vice-versa. To prevent such unacceptable electromagnetic interference, it is known in the prior art to apply a conformal radiation shield to the package body of the semiconductor package.

In those QFN packages to which a conformal shield is applied, it is advantageous to place such conformal shield into electrical communication with one or more of the tie bars and/or one or more of the leads of the semiconductor package. Though it is typically not desirable to have to electrically connect all of the leads and tie bars to the conformal shield subsequently formed on the package body, the leadframe design of many currently known QFN packages does not lend itself to the electrical connection of the conformal shield to only select leads and/or tie bars. The present invention addresses this issue by, among other things, providing a QFN package semiconductor package including a leadframe wherein the leads of the leadframe are selectively half-etched so that portions one or more prescribed leads are exposed in a package body of the semiconductor package and electrically connected to an electromagnetic interference (EMI) shielding layer applied to the package body. These, as well as other features and advantages of the present invention will be discussed in more detail below.

BRIEF SUMMARY OF THE INVENTION

In accordance with the present invention, there is provided a quad flat no leads (QFN) semiconductor device or package including a leadframe wherein the leads of the leadframe are selectively formed so that portions one or more prescribed leads are exposed in a package body of the semiconductor package and electrically connected to an electromagnetic interference (EMI) shielding layer applied to the package body. In certain embodiments of the present invention, one or more tie bars of the leadframe may also be selectively formed so as to be exposed in the package body of the semiconductor package and electrically connected to the shielding layer applied to the package body. Thus, in the present invention, the shielding layer may be electrically connected to one or more leads alone or in combination with one or more tie bars of the leadframe.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1A:
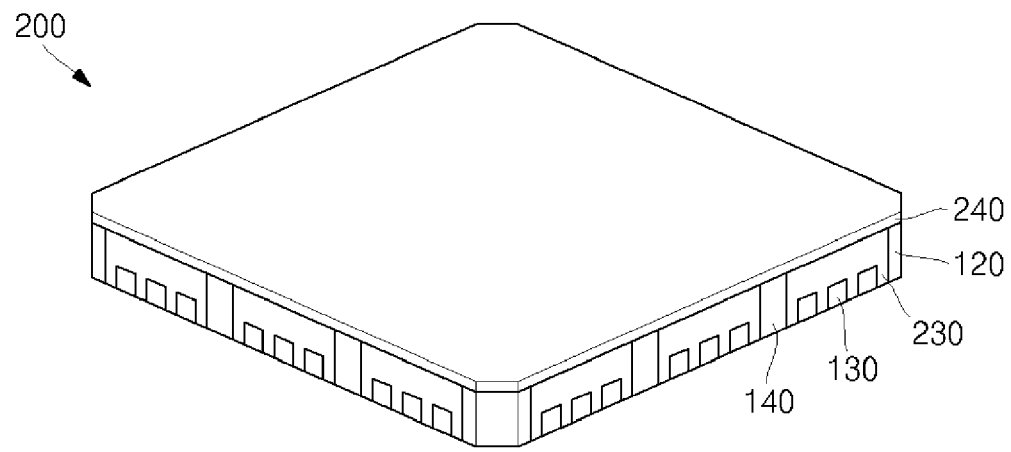
FIG. 1A is a top perspective view of a semiconductor package constructed in accordance with a first embodiment of the present invention.

Referring now to the drawings wherein the showings are for purposes of illustrating preferred embodiments of the present invention only, and not for purposes of limiting the same, FIGS. 1A-1E depict a semiconductor device or package 200 constructed in accordance with a first embodiment of the present invention. As will be described in more detail below, the semiconductor package 200 is a quad flat no leads (QFN) package, though the present invention is not limited to this specific type of semiconductor package configuration.

One the primary structural features of the semiconductor package 200 is its leadframe 100. The leadframe 100, in its original unsingulated state, comprises an outer frame or dambar (not shown) which has a generally quadrangular configuration, and is removed from the remainder of the leadframe 100 after the fabrication of the semiconductor package 200 is completed in a manner which will be described in more detail below. Disposed within the open interior of the dambar is a die paddle or die pad 110 of the leadframe 100. Like the dambar, the die pad 110 also has a generally quadrangular (e.g., square) configuration, and defines four peripheral edge segments. As viewed from the perspective shown in FIGS. 1C and 1D, the die pad 110 also defines a generally planar top surface, and an opposed, generally planar bottom surface. In the process of fabricating the leadframe 100, the die pad 110 is preferably subjected to a partial etching process which facilitates the formation of a recessed shoulder or shelf 111 therein. The shelf 111 substantially circumvents the bottom surface of the die pad 110, and is disposed in opposed relation to a wire bonding area 112 defined by a peripheral portion of the top surface of the die pad 110. The peripheral wire bonding area 112 of the die pad 110 may be plated with gold (Au) or silver (Ag) to enhance a wire bonding operation which will be described below. The depth of the shelf 111 is preferably about one-half of the total thickness of the die pad 110 (i.e., the distance separating the top and bottom surfaces of the die pad 110 from each other). The functionality of the shelf 111 will also be discussed in more detail below.

Figure 1B:
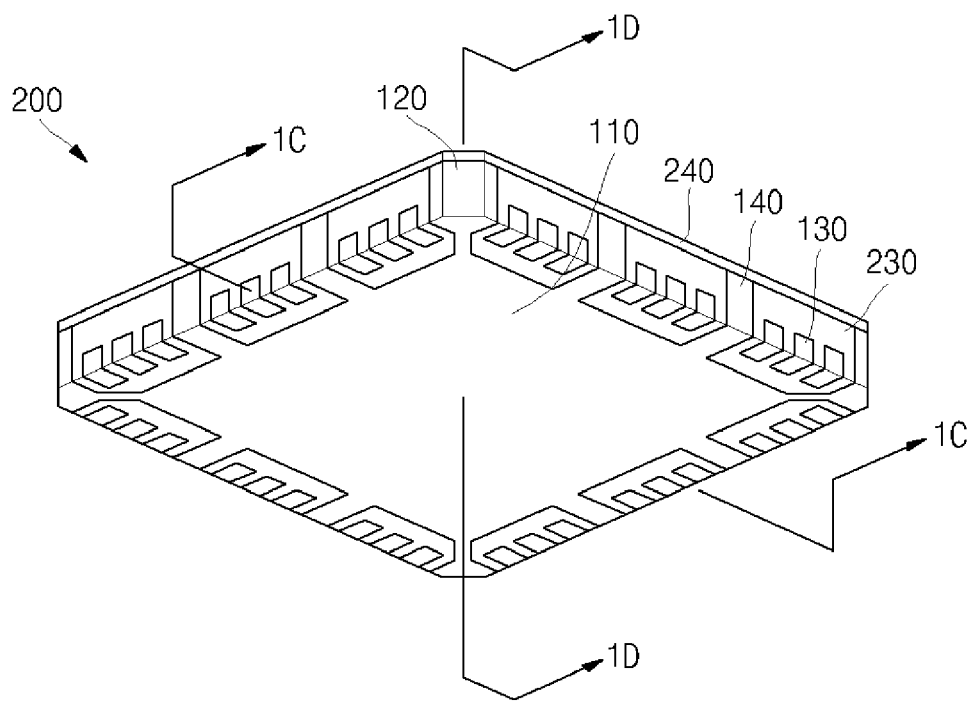
FIG. 1B is a bottom perspective view of the semiconductor package shown in FIG. 1A.

In the leadframe 100, the die pad 110 is supported or suspended within the open interior of the dambar through the use of a plurality of tie bars 120. The tie bars 120 are integrally connected to and extend diagonally from respective ones of the four corner regions defined by the die pad 110. Those ends of the tie bars 120 opposite those connected to the die pad 110 are integrally connected to the dambar of the leadframe 100. Each of the tie bars 120 defines a generally planar top surface which, when viewed from the perspective shown in FIG. 1D, is elevated above the top surface of the die pad 110. Thus, the top surface of the die pad 110 and the top surfaces of the tie bars 120 extend along respective ones of a spaced, generally parallel pair of planes. In addition to the top surface, each of the tie bars 120 defines a generally planar bottom surface which is disposed in opposed relation to the top surface thereof, and extends in generally co-planar relation to the bottom surface of the die pad 110 as also shown in FIG. 1D. Thus, the thickness of each of the tie bars 120 (i.e., the distance between the top and bottom surfaces thereof) exceeds the thickness of the die pad 110. Like the die pad 110, each of the tie bars 120 is preferably subjected to a partial etching process which facilitates the formation of a recessed shoulder or shelf 121 therein. As further seen in FIG. 1D, each shelf 121 is recessed relative to the bottom surface of the corresponding tie bar 120, and extends in continuous, generally co-planar relation to the shelf 111 of the die pad 110. The functionality of the shelf 121 included in each tie bar 120 will also be discussed in more detail below.

In addition to the die pad 110 and tie bars 120, the leadframe 100 comprises a plurality of first leads 130. In the leadframe 100, the first leads 130 are preferably segregated into four sets, with each set of the first leads 130 being integrally connected to the dambar and extending into the open interior thereof toward a respective one of the peripheral edge segments defined by the die pad 110. As is apparent from FIG. 1E, each of the first leads 130 extends generally perpendicularly from the dambar of the leadframe 100, and is sized so as to be maintained in spaced relation to (i.e., not to contact) the corresponding peripheral edge segment of the die pad 110. In this regard, the first leads 130 of each set are arranged at a predetermined pitch while being spaced from respective ones of the peripheral edge segments of the die pad 110.

Figure 1C:
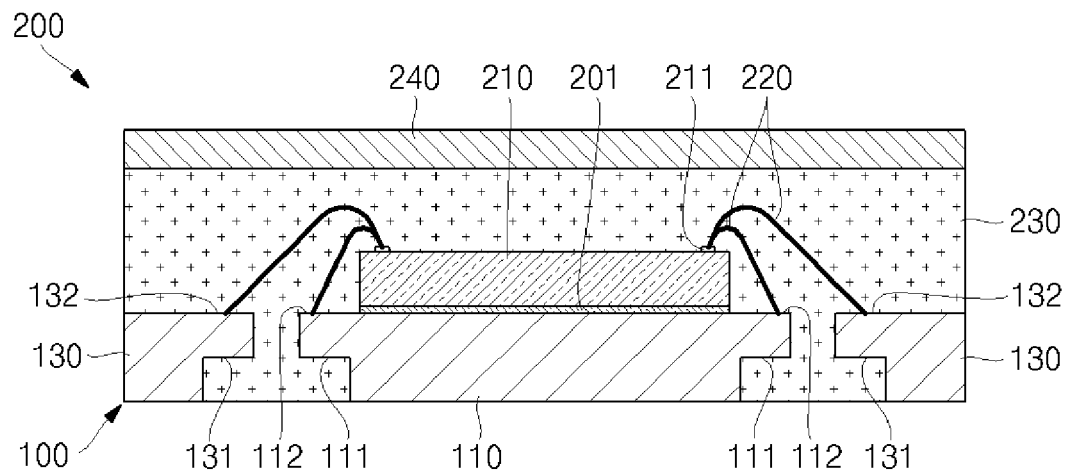
FIG. 1C is a cross-sectional view taken along line 1C-1C of FIG. 1B.
Figure 1D:
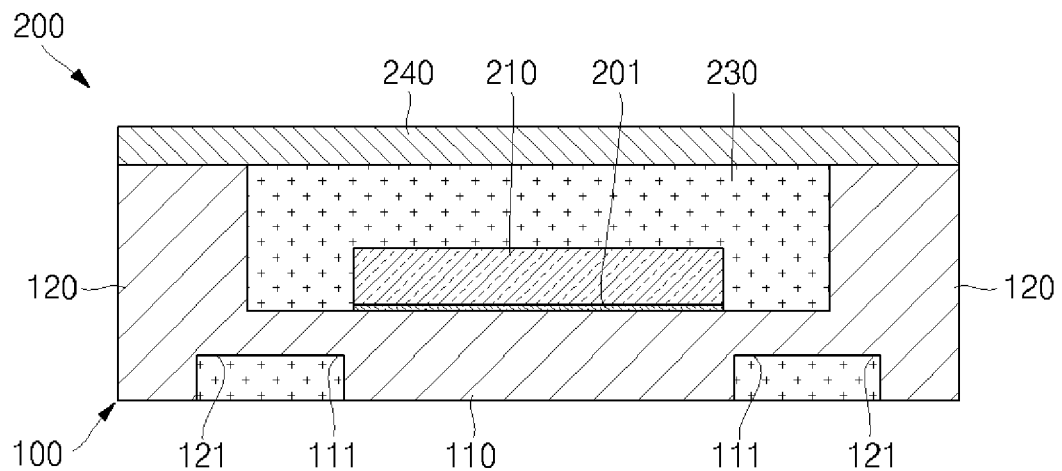
FIG. 1D is a cross-sectional view taken along line 1D-1D of FIG. 1B.

As best seen in FIG. 1C, each of the first leads 130 defines a generally planar top surface and an opposed, generally planar bottom surface. The thickness of each of the first leads 130 (i.e., the distance between the opposed top and bottom surfaces thereof) is preferably substantially equal to the thickness of the die pad 110. Thus, in the leadframe 100, the top surfaces of the first leads 130 preferably extend in generally co-planar relation to the top surface of the die pad 110, and are situated below the top surfaces of the tie bars 120. Additionally, the bottom surfaces of the first leads 130 preferably extend in generally co-planar relation to the bottom surface of the die pad 110 and thus the bottom surfaces of the tie bars 120.

In the process of fabricating the leadframe 100, each of the first leads 130 is preferably subjected to a partial etching process which facilitates the formation of a recessed shoulder of shelf 131 therein. As shown in FIG. 1C, the shelf 131 of each first lead 130 is recessed relative to the bottom surface thereof, and extends to the inner end of such first lead 130 disposed closest to a corresponding peripheral edge segment of the die pad 110. Additionally, the shelf 131 of each first lead 130 extends in generally co-planar relation to the shelf 111 of the die pad 110, and thus the shelf 121 included in each tie bar 120. As is further seen in FIG. 1C, at least a portion of the top surface of each first lead 130 which is disposed in opposed relation to the shelf 131 thereof defines a wire bonding area 132. The wire bonding area 132 of each first lead 130 may be plated with gold (Au) or silver (Ag) to enhance a wire bonding operation which will be described below.

In addition to the first leads 130, the lead frame 100 of the semiconductor package 200 includes a plurality of second leads 140. In the leadframe 100, the second leads 140 are also preferably segregated into four sets, with each set of the second leads 140 being integrally connected to and extending generally perpendicularly between the dambar and a corresponding peripheral edge segment of the die pad 110 in the manner best shown in FIG. 1E. As further seen in FIG. 1E, the second leads 140 of each set each extend between an adjacent pair of the first leads 130 of a corresponding set thereof. Due to their integral connection to the die pad 110, the second leads 140 are each electrically connected to the die pad 110, and hence to each of the tie bars 120 which are also integrally connected to the die pad 110.

Each of the second leads 140 defines a generally planar top surface and an opposed, generally planar bottom surface. The top surface of each of the second leads 140 extends in generally co-planar relation to the top surfaces of the tie bars 120, and thus is elevated above the top surface of the die pad 110 and the top surfaces of the first leads 130. Thus, whereas the top surface of the die pad 110 and the top surfaces of the first leads 130 extend in generally co-planar relation to each other along a common first plane, the top surfaces of the tie bars 120 and second leads 140 extend in generally co-planar relation to each other along a common second plane which is disposed in spaced, generally parallel relation to the first plane. The bottom surfaces of the second leads 140 extend in generally co-planar relation to the bottom surface of the die pad 110, the bottom surfaces of the tie bars 120, and the bottom surfaces of the first leads 130. Thus, the bottom surfaces of the first and second leads 130, 140, the tie bars 120 and die pad 110 extend along a common third plane which itself extends in spaced, generally parallel relation to the aforementioned first and second planes, the first plane residing between the second and third planes. Though not shown, it is contemplated that each of the second leads 140 may also be subjected to a partial etching process which facilitates the formation of a recessed shoulder or shelf therein. More particularly, the shelf included in each of the second leads 140 may be recessed relative to the bottom surface thereof and formed so as to extend in continuous, generally co-planar relation to the shelf 111 of the die pad 110 in the same manner described above in relation to the shelf 121 formed in each tie bar 120.

Figure 1E:
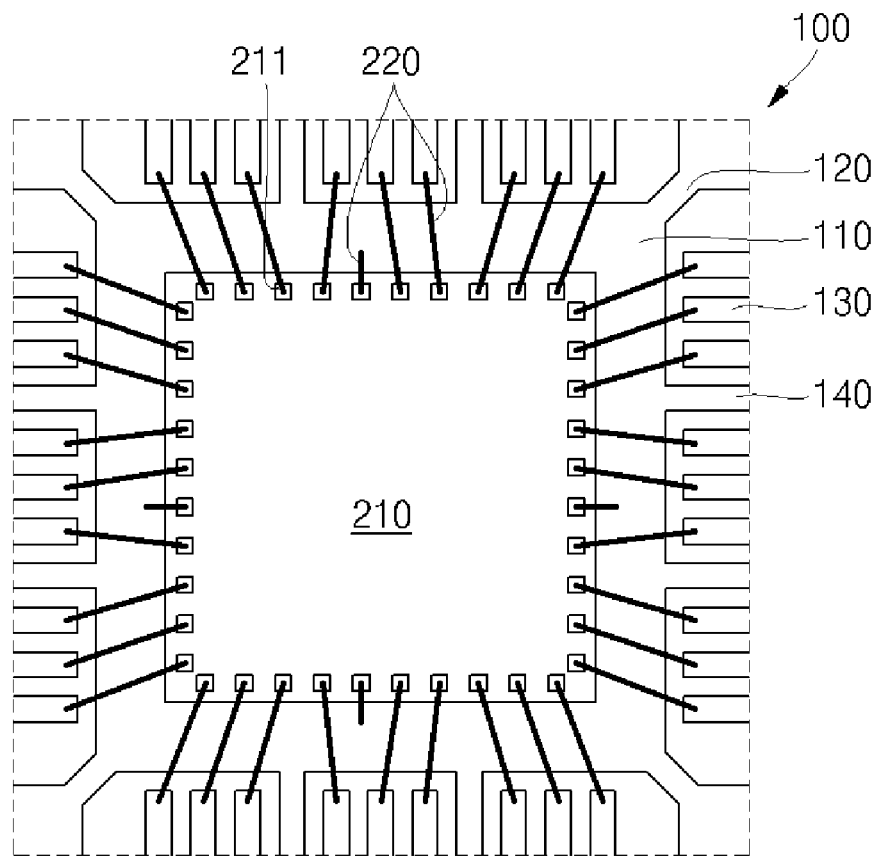
FIG. 1E is a top plan view of the semiconductor package shown in FIGS. 1A-1D with the package body removed for purposes of depicting the leadframe and other components thereof.
Figure 2A:
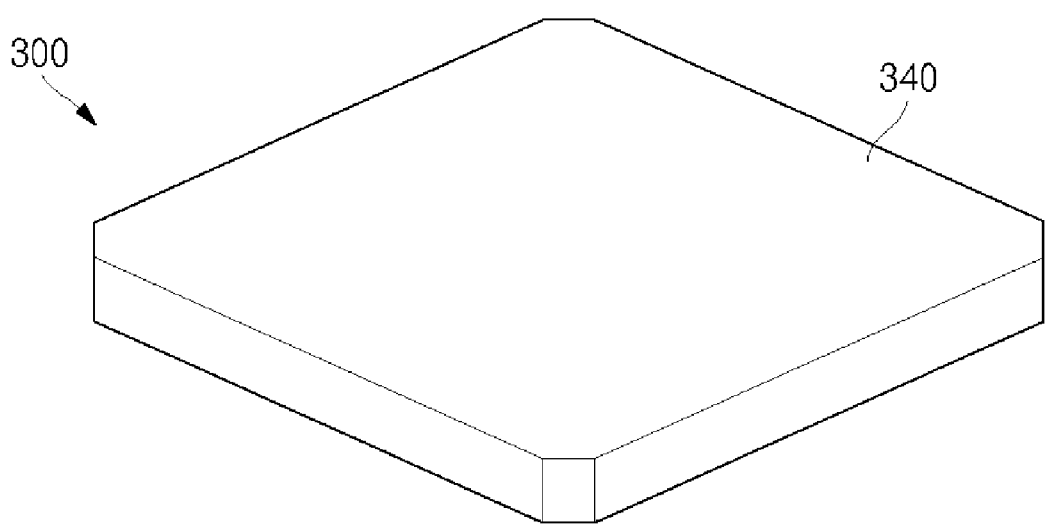
FIG. 2A is a top perspective view of a semiconductor package constructed in accordance with a second embodiment of the present invention.
Figure 2B:
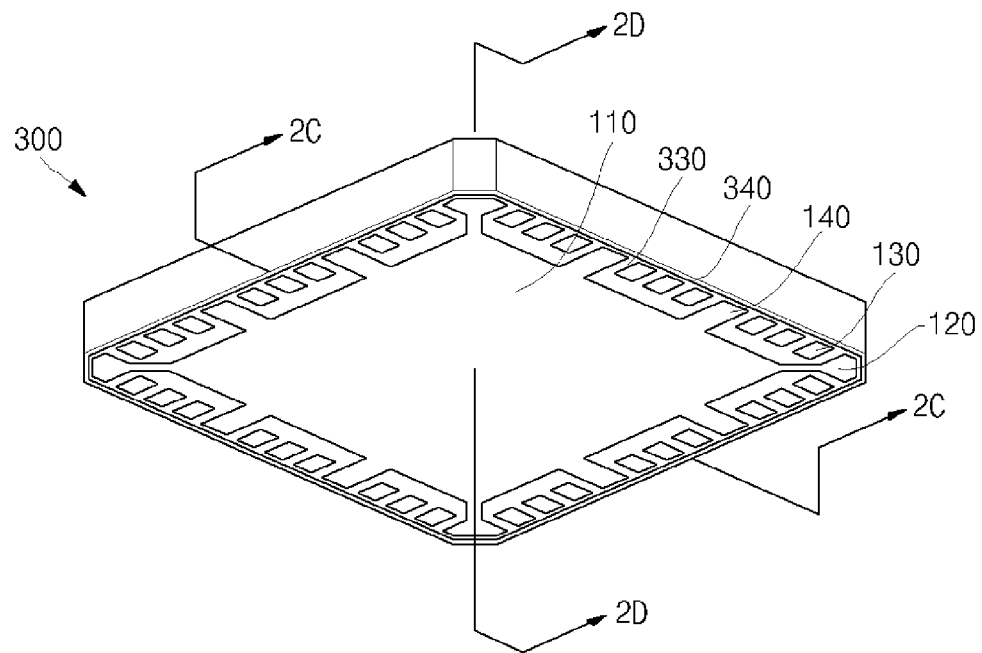
FIG. 2B is a bottom perspective view of the semiconductor package shown in FIG. 2A.
Figure 2C:
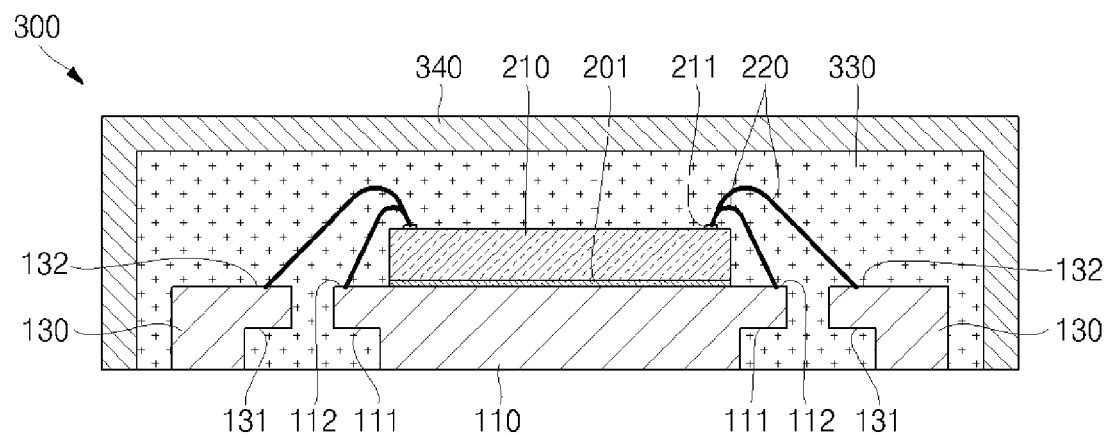
FIG. 2C is a cross-sectional view taken along line 2C-2C of FIG. 2B.
Figure 2D:
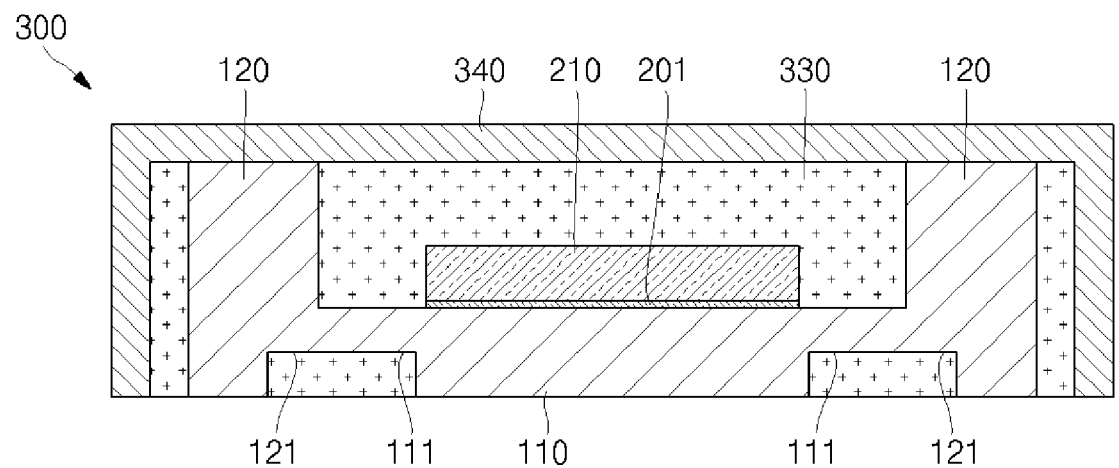
FIG. 2D is a cross-sectional view taken along line 2D-2D of FIG. 2B.

In the exemplary leadframe 100 shown in FIG. 1E, nine (9) first leads 130 are included in each of the four (4) sets thereof, with two (2) second leads 140 being included in each of the four (4) sets thereof. Additionally, each set of the second leads 140 is arranged relative to a corresponding set of the first leads 130 such that the second leads 140 of each set effectively segregate the first leads 130 of the corresponding set into three (3) groups of three (3) first leads 130 each. More particularly, the outermost two groups of three first leads 130 each extend between one of the second leads 140 of the corresponding set and one of the tie bars 120, with the middle group of three first leads 130 being disposed between the second leads 140 of the corresponding set. However, those of ordinary skill in the art will recognize that the aforementioned number and arrangement between the first and second leads 130, 140 is exemplary only, and may be varied without departing from the spirit and scope of the present invention.

Referring now to FIGS. 1C, 1D and 1E, in addition to the leadframe 100, the semiconductor package 200 comprises a semiconductor die 210 which is attached to the top surface of the die pad 110. More particularly, the semiconductor die 210 defines opposed, generally planar top and bottom surfaces, with the bottom surface of the semiconductor die 210 being attached to a central portion of the top surface of the die pad 110 through the use of a layer 201 of a suitable adhesive. As such, the semiconductor die 210 is circumvented by the plated wire bonding area 112 of the die pad 110. Disposed on the top surface of the semiconductor die 210 is a plurality of conductive bond pads or terminals 211, at least some of which are electrically connected to respective ones of the first leads 130 through the use of conductive wires 220.

As seen in FIG. 1E, one or more conductive wires 220 are also used to electrically connect one or more of the terminals 211 to the die pad 110. More particularly, it is contemplated that for those terminals 211 electrically connected to the first leads 130, the corresponding wires 220 will extend between the terminals 211 and the plated wire bonding areas 132 defined on the top surfaces of the corresponding first leads 130. It is also contemplated that for any terminal(s) 211 electrically connected to the die pad 110, the corresponding wire(s) 220 will extend between the terminal(s) 211 and the plated wire bonding area 112 defined by the peripheral portion of the top surface of the die pad 110. Thus, conductive wires 220 are bonded to the wire bonding areas 132 of the first leads 130 and the wire bonding area 112 of the die pad 110. Examples of suitable materials for the conductive wires 220 include, but are not limited to, aluminum (Al), gold (Au), copper (Cu) and equivalents thereof. As indicated above, plating the wire bonding areas 112, 132 with gold or silver facilitates greater ease in the aforementioned wire bonding operation. However, it is contemplated that the leadframe 100 may be a pre-plated one (PPF) to avoid the need to engage in a separate plating process subsequent to the formation of the die pad 110, tie bars 120 and first and second leads 130, 140.

In the semiconductor package 200, the semiconductor die 210, the wires 220, and portions of the leadframe 100 are covered by an encapsulant material which ultimately hardens into a package body 230 of the semiconductor package 200. As seen in FIGS. 1B, 1C and 1D, the package body 230 defines a generally planar top surface, a generally planar bottom surface, and a side surface which extends generally perpendicularly between the top and bottom surfaces. The side surface of the package body 230 defines four generally planar side surface sections.

The package body 230 of the semiconductor package 200 is formed such that the top surfaces of the tie bars 120 and second leads 140, in addition to extending in co-planar relation to each other, extend in substantially flush, co-planar relation to the top surface of the package body 230. However, the top surfaces of the first leads 130, including the wire bonding areas 132 defined thereby, are completely covered by the package body 230 since, as indicated above, the top surfaces of the first leads 130 are recessed relative to the top surfaces of the tie bars 120 and second leads 140. The package body 230 is also formed such that the bottom surface of the die pad 110, the bottom surfaces of the tie bars 120, and the bottom surfaces of the first and second leads 130, 140, in addition to extending in generally co-planar relation to each other, also extend in substantially flush, co-planar relation to the bottom surface of the package body 230. Thus, whereas the top surfaces of the tie bars 120 and second leads 140 are exposed in the top surface of the package body 230, the bottom surface of the die pad 110, the bottom surfaces of the tie bars 120, and the bottom surfaces of the first and second leads 130, 140 are exposed in the bottom surface of the package body 230.

In addition to the foregoing, the package body 230 is applied to the leadframe 100 such that when the dambar is ultimately singulated or removed from the remainder of the leadframe 100, each of the first and second leads 130, 140 will define a generally planar outer end which extends in substantially flush, co-planar relation to a corresponding one of the side surface sections of the package body 230 in the manner best shown in FIGS. 1A and 1B. The singulation or removal of the dambar from the remainder of the leadframe 100 will also result in each of the tie bars 120 defining a generally planar outer end which extends diagonally between a corresponding adjacent pair of the side surface sections of the package body 230.

Importantly, the encapsulant material applied to the leadframe 100 and used to form the package body 230 covers the shelf 111 of the die pad 110, the shelves 121 of the tie bars 120, the shelves 131 of the first leads 130, and any shelves formed in the second leads 140. The encapsulation of the shelves 111, 121, 131 and any shelves included in the second leads 140 by the package body 230 enhances the locking of the die pad 110, the tie bars 120, and the first and second leads 130, 140 to the package body 230, leading to improve bonding therebetween. Further, the shelf 111 formed in the die pad 110 increases the distance that moisture must travel to reach the semiconductor die 210, in comparison to the length of the moisture path that would exist if the die pad 110 was not provided with the shelf 111. Thus, the inclusion of the shelf 111 in the die pad 110, in addition to the increasing the mechanical locking strength between the die pad 110 and the package body 230, also assists in preventing the deterioration of the performance of the semiconductor package 200 as a result of moisture penetration.

The semiconductor package 200 further comprises a conductive EMI shielding layer 240 which is applied to a portion of the package body 230. More particularly, as seen in FIGS. 1A, 1B, 1C and 1D, the shielding layer 240 is formed on the top surface of the package body 230 and electrically connected to the tie bars 120 and the second leads 140 which, as indicated above, each have top surfaces which are exposed in the top surface of the package body 230. By virtue of its electrical connection to the tie bars 120 and the second leads 140, the shielding layer 240 is also electrically connected to the die pad 110 since, as also indicated above, the tie bars 120 and the second leads 140 are each integrally connected to the die pad 110. The shielding layer 240 can be formed of a conductive material selected from silver (Ag), copper (Cu), aluminum (Al), nickel (Ni) and gold (Au).

It is contemplated that when the semiconductor package 200 is attached and electrically connected to an external electronic device (not shown), the die pad 110, the bottom surface of which is exposed in the bottom surface of the package body 230 as indicated above, will serve as a ground and itself be electrically connected to the grounds of the external electronic device. The tie bars 120 also serve as grounds since they are electrically connected to the die pad 110, and may each also be electrically connected to the grounds of the external electronic device. The second leads 140 may also serve as grounds since they are each electrically connected to the die pad 110 and may each be electrically connected to the grounds of the external electronic device as well. As will be recognized, the wires 220 used to facilitate the electrical connection of one or more of the terminals 211 of the semiconductor die 210 to the wire bonding area 112 of the die pad 110 provide a grounding function. The first leads 130 of the semiconductor package 200 are used for signal transmission and serve as signal input/output paths through which signals are transmitted between the semiconductor die 210 and the external electronic device.

In the semiconductor package 200, the electrical connection of the shielding layer 240 to the die pad 110, the tie bars 120 and the second leads 140, all of which are electrically connected to the grounds of the external electronic device, enables the formation of a ground pattern over the entire region of the semiconductor package 200. The ground pattern can shield electromagnetic interference (EMI) from the inside or outside of the semiconductor die 210. Thus, the shielding layer 240 is useful for the formation of a ground pattern effectively capable of shielding electromagnetic interference from the inside or outside of the semiconductor die 210 in the semiconductor package 200. Stated another way, the use of the ground pattern provided by the inclusion of the increased thickness tie bars 120 and second leads 140 in the semiconductor package 200 increases the shielding efficiency of the semiconductor package 200 against electromagnetic interference from the inside or outside of the semiconductor die 210.

Figure 5:
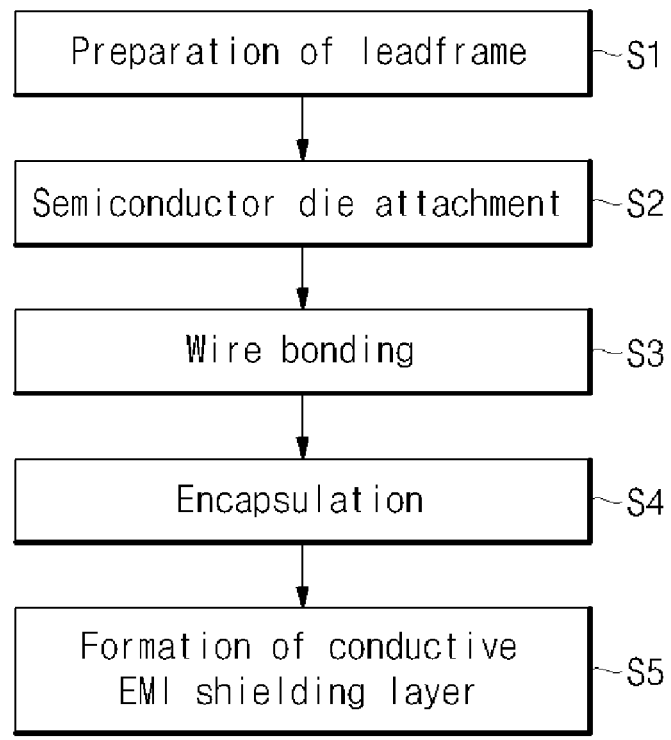
FIG. 5 is a flow chart illustrating an exemplary fabrication method for the semiconductor package shown in FIGS. 1A-1E.

Referring now to FIG. 5, there is provided a flow chart which sets forth an exemplary method for fabricating the semiconductor package 200 of the present invention shown in FIGS. 1A-1E. The method comprises the steps of preparing the leadframe 100 (S1), the attachment of the semiconductor die 210 to the leadframe 100 (S2), the wire bonding of the semiconductor die 210 to the leadframe 100 through the use of the wires 220 (S3), the encapsulation of the semiconductor die 210, wires 220 and portions of the leadframe 100 with an encapsulant material to form the package body 230 (S4), and the formation of the shielding layer 240 on the package body 230 (S5). FIGS. 6A-6G provide illustrations corresponding to these particular steps, as will be discussed in more detail below.

Figure 6A:
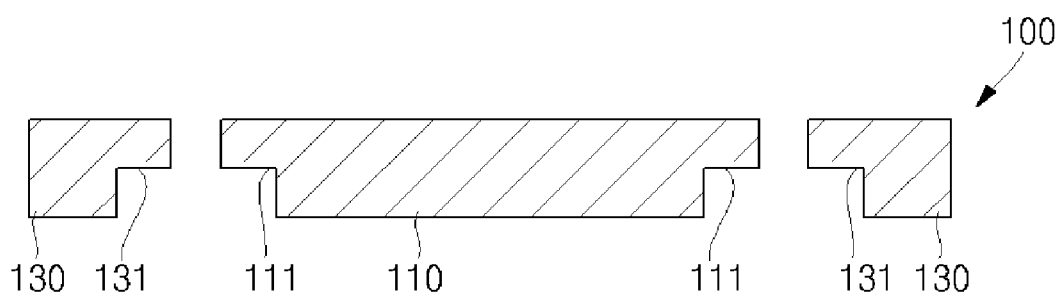
FIGS. 6A-6G are views illustrating an exemplary fabrication method for the semiconductor package shown in FIGS. 1A-1E.
Figure 6B:
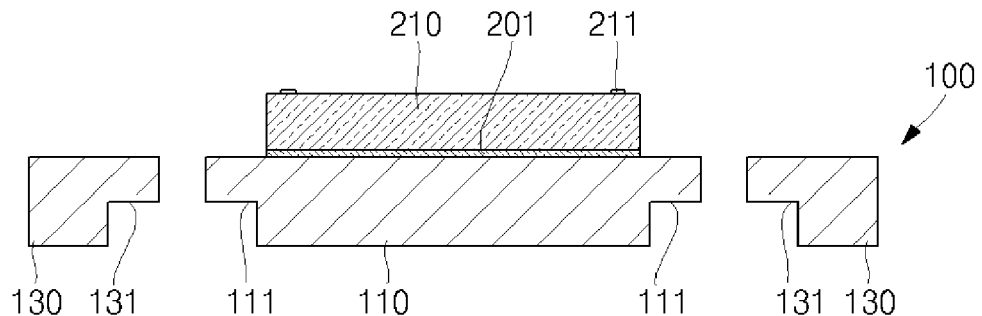

Referring now to FIG. 6A, in the initial step S1 of the fabrication process for the semiconductor package 200, the leadframe 100 having the above-described structural attributes is provided. Thereafter, as illustrated in FIG. 6B, step S2 is completed wherein the bottom surface of the semiconductor die 210 is attached to the central portion of the top surface of the die pad 110 through the use of the adhesive layer 201.

Figure 6C:
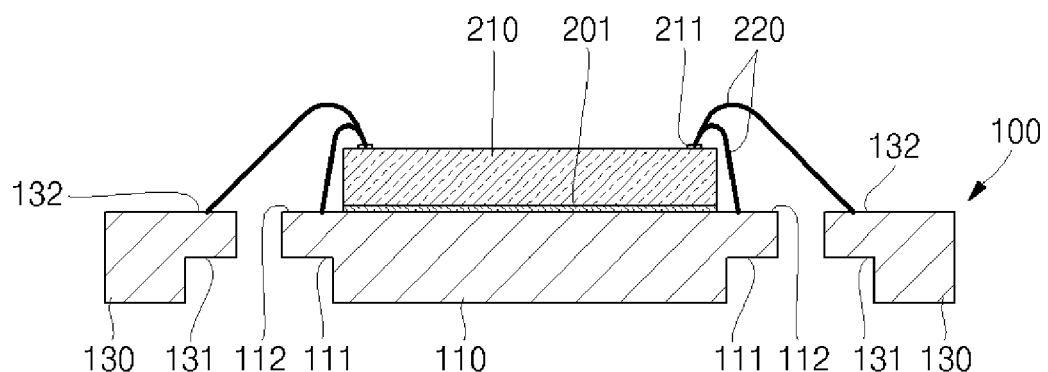
Figure 6D:
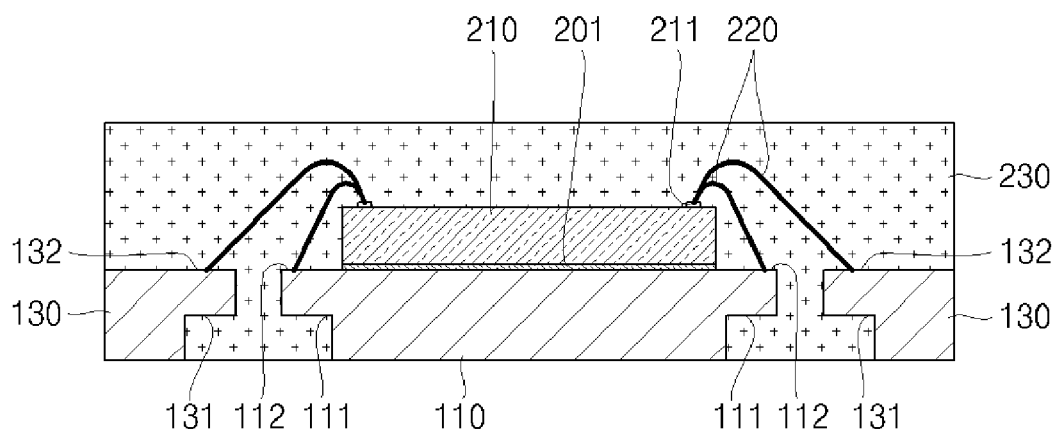
Figure 6E:
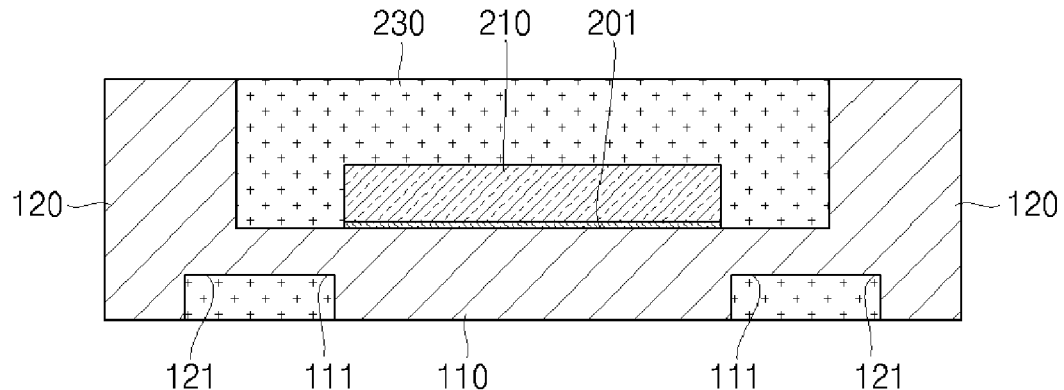

Referring now to FIG. 6C, in the next step S3 of the fabrication process for the semiconductor package 200, the terminals 211 of the semiconductor die 210 are electrically connected to the wire bonding area 112 of the die pad 110 and the wire bonding areas 132 of the first leads 130 through the use of the conductive wires 220 in the above-described manner. Thereafter, as shown in FIGS. 6D and 6E, in the next step S4 of the fabrication process for the semiconductor package 200, the semiconductor die 210, the wires 220, and portions of the die pad 110, tie bars 120 and first and second leads 130, 140 are each encapsulated or covered by an encapsulant material which ultimately hardens into the package body 230 of the semiconductor package 200. As indicated above, the package body 230 is formed such that the top surfaces of the tie bars 120 and second leads 140 extend in generally flush or co-planar relation to the top surface of the package body 230. Additionally, the bottom surfaces of the die pad 110, tie bars 120 and first and second leads 130, 140 extend in generally flush or co-planar relation to the bottom surface of the package body 230. As also previously explained, upon the singulation or removal of the dambar of the leadframe 100 from the remainder thereof, the first and second leads 130, 140 will each define an outer end which extends in generally flush or co-planar relation to respective side surface sections defined by the package body 230, with each of the tie bars 120 defining an outer end which extends diagonally between a corresponding pair of such side surface sections.

Figure 6F:
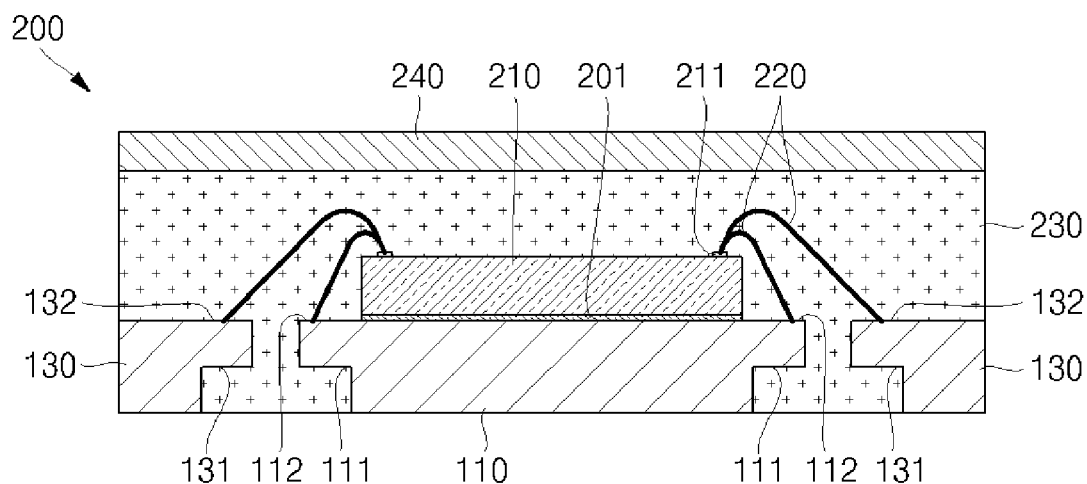
Figure 6G:
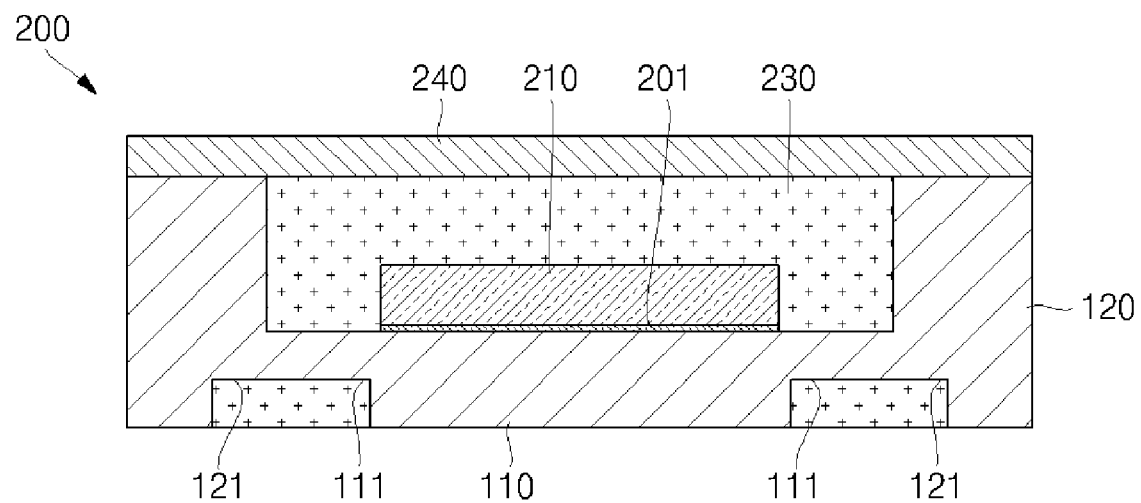

Referring now to FIGS. 6F and 6G, in the final step S5 of the fabrication process for the semiconductor package 200, a conductive material is applied to the top surface of the package body 230 by a coating or plating technique to form the conductive EMI shielding layer 240. As a result, the shielding layer 240 is electrically connected to the tie bars 120 and the second leads 140. Though not illustrated, the aforementioned dambar is removed from the remainder of the leadframe through the use of a cutting tool, with the singulation or removal of the dambar effectively electrically isolating the first leads 130 from the tie bars 120, second leads 140, and die pad 110. Typically, a plurality of semiconductor packages 200 will be simultaneously fabricated in the form of a matrix comprising a plurality of interconnected leadframes 100. In the cutting step, the individual semiconductor packages 200 are separated from such leadframe strip.

Referring now to FIGS. 2A-2D, there is shown a semiconductor device or package 300 constructed in accordance with a second embodiment of the present invention. The semiconductor package 300 bears a high level of structural similarity to the above-described semiconductor package 200, with only the distinctions between the semiconductor packages 300, 200 being described below.

One distinction between the semiconductor packages 300, 200 lies in the shape of the package body 330 included in the semiconductor package 300 in comparison to the package body 200 included in the semiconductor package 200. More particularly, in the semiconductor package 300, the package body 330 is formed such that the outer ends of the first and second leads 130, 140 are not exposed in corresponding ones of the side surface sections of the package body 330, but rather are covered by the package body 330. Similarly, the outer ends of the tie bars 120 included in the semiconductor package 300 are not exposed in the side surface of the package body 330, but rather are covered thereby. Accordingly, in addition to the four (4) side surface sections also included in the package body 230 and described above, the package body 330 further includes four (4) generally planar corner sections, each of which extends generally diagonally between a corresponding adjacent pair of the side surface sections.

A further distinction between the semiconductor packages 300, 200 lies in the shape of the shielding layer 340 included in the semiconductor package 300 in comparison to the shielding layer 240 included in the semiconductor package 200. More particularly, in the semiconductor package 300, the conductive EMI shielding layer 340 is formed to cover the entirety of the top surface and the side surface of the package body 330, including the four (4) side surface sections and four (4) intervening corner sections defined by the side surface of the package body 330. As a result of its shape, the shielding layer 340 has a greater area than the above-described shielding layer 240, which enables the formation of a larger ground pattern over the entire region of the semiconductor package 300 in comparison to the ground pattern formed in the semiconductor package 200. Therefore, the shielding layer 340 can shield electromagnetic interference from the inside or outside of the semiconductor die 210 included in the semiconductor package 300 in a more stable and effective manner than the conductive EMI shielding layer 240 described above.

Referring now to FIGS. 3A-3E, there is shown a semiconductor device or package 400 constructed in accordance with a third embodiment of the present invention. The semiconductor package 400 includes structural features of both of the above-described semiconductor packages 200, 300, as will be described in more detail below. One the primary structural features of the semiconductor package 400 is its leadframe 100'. The leadframe 100', in its original unsingulated state, comprises an outer frame or dambar (not shown) which has a generally quadrangular configuration, and is removed from the remainder of the leadframe 100' after the fabrication of the semiconductor package 400 is completed in a manner which will be described in more detail below. Disposed within the open interior of the dambar is a die paddle or die pad 110' of the leadframe 100'. Like the dambar, the die pad 110' also has a generally quadrangular (e.g., square) configuration, and defines four peripheral edge segments. As viewed from the perspective shown in FIGS. 3C and 3D, the die pad 110' also defines a generally planar top surface, and an opposed, generally planar bottom surface. In the process of fabricating the leadframe 100', the die pad 110' is preferably subjected to a partial etching process which facilitates the formation of a recessed shoulder or shelf 111' therein. The shelf 111' substantially circumvents the bottom surface of the die pad 110', and is disposed in opposed relation to a wire bonding area 112' defined by a peripheral portion of the top surface of the die pad 110'. The peripheral wire bonding area 112' of the die pad 110' may be plated with gold (Au) or silver (Ag) to enhance a wire bonding operation which will be described below. The depth of the shelf 111' is preferably about one-half of the total thickness of the die pad 110' (i.e., the distance separating the top and bottom surfaces of the die pad 110' from each other). The functionality of the shelf 111' will also be discussed in more detail below.

Figure 3A:
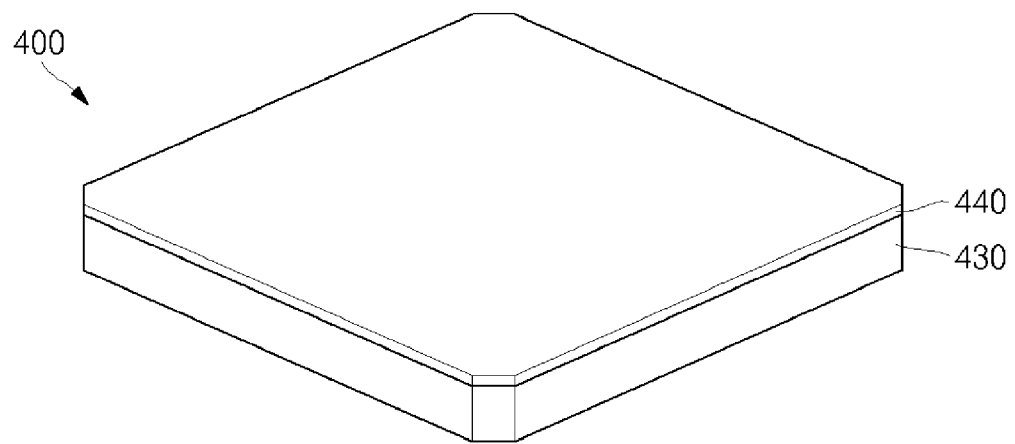
FIG. 3A is a top perspective view of a semiconductor package constructed in accordance with a third embodiment of the present invention.
Figure 3B:
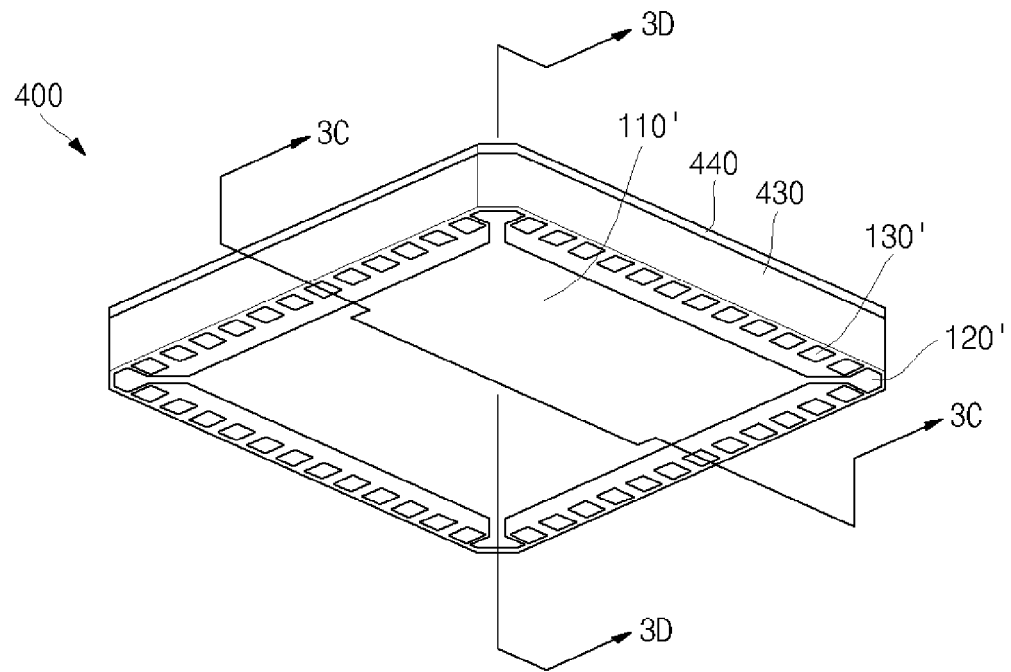
FIG. 3B is a bottom perspective view of the semiconductor package shown in FIG. 3A.

In the leadframe 100', the die pad 110' is supported or suspended within the open interior of the dambar through the use of a plurality of tie bars 120'. The tie bars 120' are integrally connected to and extend diagonally from respective ones of the four corner regions defined by the die pad 110'. Those ends of the tie bars 120' opposite those connected to the die pad 110' are integrally connected to the dambar of the leadframe 100'. Each of the tie bars 120' defines a generally planar top surface which, when viewed from the perspective shown in FIG. 3D, extends in continuous, generally co-planar relation to the top surface of the die pad 110'. In addition to the top surface, each of the tie bars 120' defines a generally planar bottom surface which is disposed in opposed relation to the top surface thereof, and extends in generally co-planar relation to the bottom surface of the die pad 110' as also shown in FIG. 3D. Thus, the thickness of each of the tie bars 120' (i.e., the distance between the top and bottom surfaces thereof) is substantially equal to the thickness of the die pad 110'. Like the die pad 110', each of the tie bars 120' is preferably subjected to a partial etching process which facilitates the formation of a recessed shoulder or shelf 121' therein. As further seen in FIG. 3D, each shelf 121' is recessed relative to the bottom surface of the corresponding tie bar 120', and extends in continuous, generally co-planar relation to the shelf 111' of the die pad 110'. The functionality of the shelf 121' included in each tie bar 120' will also be discussed in more detail below.

In addition to the die pad 110' and tie bars 120', the leadframe 100' comprises a plurality of first leads 130'. In the leadframe 100', the first leads 130' are preferably segregated into four sets, with each set of the first leads 130' being integrally connected to the dambar and extending into the open interior thereof toward a respective one of the peripheral edge segments defined by the die pad 110'. As is apparent from FIG. 3E, each of the first leads 130' extends generally perpendicularly from the dambar of the leadframe 100', and is sized so as to be maintained in spaced relation to (i.e., not to contact) the corresponding peripheral edge segment of the die pad 110'. In this regard, the first leads 130' of each set are arranged at a predetermined pitch while being spaced from respective ones of the peripheral edge segments of the die pad 110'.

Figure 3C:
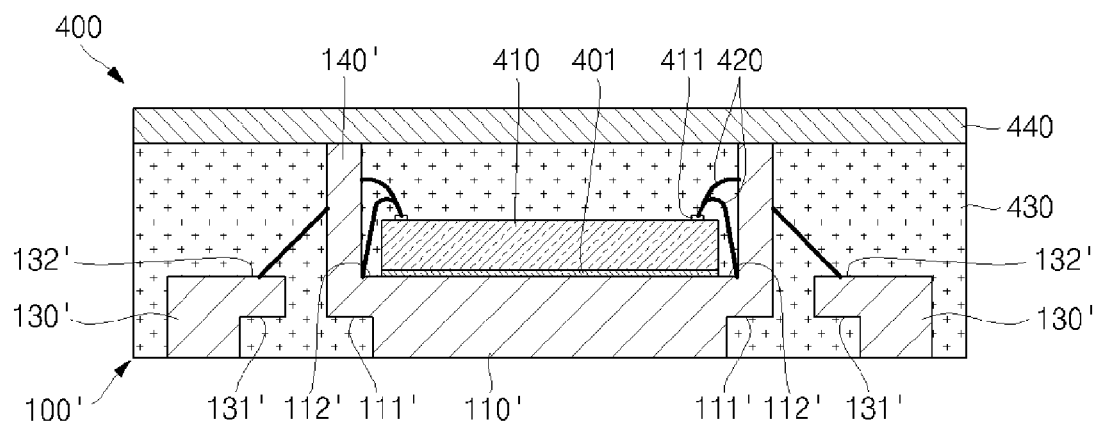
FIG. 3C is a cross-sectional view taken along line 3C-3C of FIG. 3B.
Figure 3D:
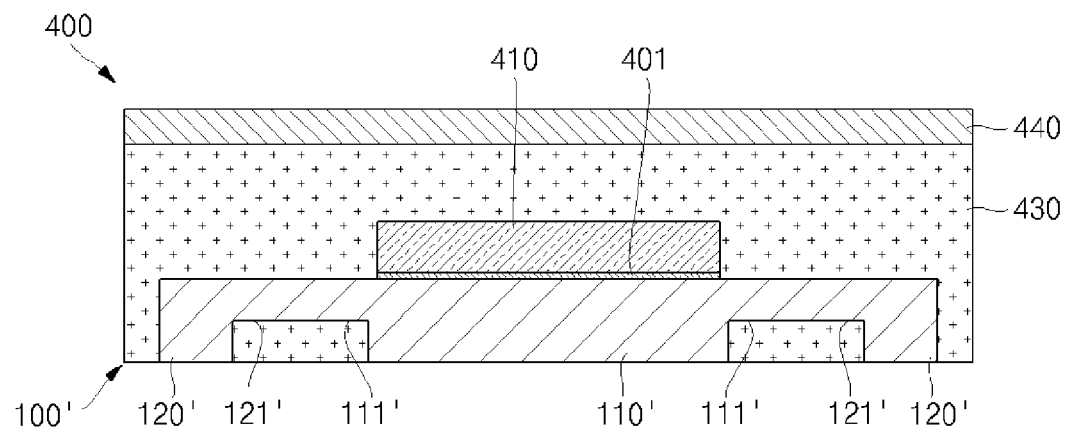
FIG. 3D is a cross-sectional view taken along line 3D-3D of FIG. 3B.

As best seen in FIG. 3C, each of the first leads 130' defines a generally planar top surface and an opposed, generally planar bottom surface. The thickness of each of the first leads 130' (i.e., the distance between the opposed top and bottom surfaces thereof) is preferably substantially equal to the thickness of the die pad 110' and each of the tie bars 120'. Thus, in the leadframe 100', the top surfaces of the first leads 130' preferably extend in generally co-planar relation to the top surfaces of the die pad 110' and tie bars 120'. Additionally, the bottom surfaces of the first leads 130' preferably extend in generally co-planar relation to the bottom surface of the die pad 110' and thus the bottom surfaces of the tie bars 120'.

In the process of fabricating the leadframe 100', each of the first leads 130' is preferably subjected to a partial etching process which facilitates the formation of a recessed shoulder of shelf 131' therein. As shown in FIG. 3C, the shelf 131' of each first lead 130' is recessed relative to the bottom surface thereof, and extends to the inner end of such first lead 130' disposed closest to a corresponding peripheral edge segment of the die pad 110'. Additionally, the shelf 131' of each first lead 130' extends in generally co-planar relation to the shelf 111' of the die pad 110', and thus the shelf 121' included in each tie bar 120'. As is further seen in FIG. 3C, at least a portion of the top surface of each first lead 130' which is disposed in opposed relation to the shelf 131' thereof defines a wire bonding area 132'. The wire bonding area 132' of each first lead 130' may be plated with gold (Au) or silver (Ag) to enhance a wire bonding operation which will be described below.

In addition to the first leads 130', the leadframe 100' of the semiconductor package 400 includes a plurality of second leads 140'. In the leadframe 100', the second leads 140' are also preferably segregated into four sets, with each set of the second leads 140' being integrally connected to the peripheral wire bonding area 112' of the die pad 110' and extending generally perpendicularly relative to the generally planar top surface of the die pad 110' in the manner best shown in FIGS. 3C and 3E. Due to their integral connection to the die pad 110', the second leads 140' are each electrically connected to the die pad 110', and hence to each of the tie bars 120' which are also integrally connected to the die pad 110'. Each of the second leads 140' defines a generally planar top surface which, due to the configuration of the second leads 140', is elevated above the generally co-planar top surfaces of the die pad 110', the tie bars 120', and the first leads 130'. Thus, whereas the top surfaces of the die pad 110', the tie bars 120' and the first leads 130' extend in generally co-planar relation to each other along a common first plane, the top surfaces of the second leads 140' extend in generally co-planar relation to each other along a common second plane which is disposed in spaced, generally parallel relation to the first plane. The bottom surfaces of the die pad 110', tie bars 120' and first leads 130' extend in generally co-planar relation to each other along a common third plane which itself extends in spaced, generally parallel relation to the aforementioned first and second planes, the first plane residing between the second and third planes.

Figure 3E:
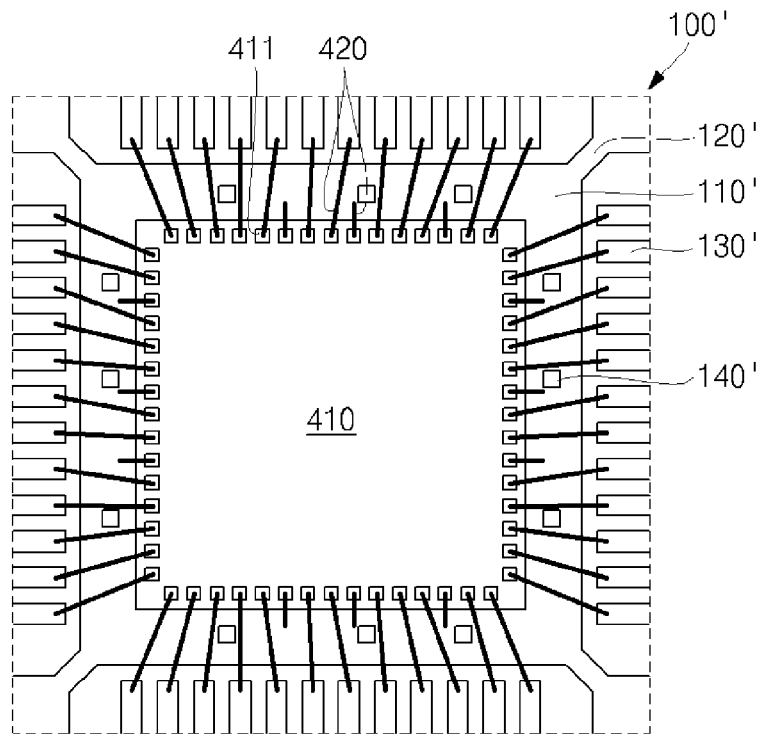
FIG. 3E is a top plan view of the semiconductor package shown in FIGS. 3A-3D with the package body removed for purposes of depicting the leadframe and other components thereof.

In the exemplary leadframe 100' shown in FIG. 3E, twelve (12) first leads 130' are included in each of the four (4) sets thereof, with three (3) second leads 140' being included in each of the four (4) sets thereof. However, those of ordinary skill in the art will recognize that the aforementioned number and arrangement of the first and second leads 130', 140' is exemplary only, and may be varied without departing from the spirit and scope of the present invention.

Referring now to FIGS. 3C, 3D and 3E, in addition to the leadframe 100', the semiconductor package 400 comprises a semiconductor die 410 which is attached to the top surface of the die pad 110'. More particularly, the semiconductor die 410 defines opposed, generally planar top and bottom surfaces, with the bottom surface of the semiconductor die 410 being attached to a central portion of the top surface of the die pad 110' through the use of a layer 401 of a suitable adhesive. As such, the semiconductor die 410 is circumvented by the plated wire bonding area 112' of the die pad 110'. Disposed on the top surface of the semiconductor die 410 is a plurality of conductive bond pads or terminals 411, at least some of which are electrically connected to respective ones of the first leads 130' through the use of conductive wires 420.

As seen in FIG. 3E, one or more conductive wires 420 are also used to electrically connect one or more of the terminals 411 to the die pad 110'. More particularly, it is contemplated that for those terminals 411 electrically connected to the first leads 130', the corresponding wires 420 will extend between the terminals 411 and the plated wire bonding areas 132' defined on the top surfaces of the corresponding first leads 130'. It is also contemplated that for any terminal(s) 411 electrically connected to the die pad 110', the corresponding wire(s) 420 will extend between the terminal(s) 411 and the plated wire bonding area 112' defined by the peripheral portion of the top surface of the die pad 110'. Thus, conductive wires 420 are bonded to the wire bonding areas 132' of the first leads 130' and the wire bonding area 112' of the die pad 110'. Examples of suitable materials for the conductive wires 420 include, but are not limited to, aluminum (Al), gold (Au), copper (Cu) and equivalents thereof. As indicated above, plating the wire bonding areas 112', 132' with gold or silver facilitates greater ease in the aforementioned wire bonding operation. However, it is contemplated that the leadframe 100' may be a pre-plated one (PPF) to avoid the need to engage in a separate plating process subsequent to the formation of the die pad 110', tie bars 120' and first and second leads 130', 140'.

In the semiconductor package 400, the semiconductor die 410, the wires 420, and portions of the leadframe 100' are covered by an encapsulant material which ultimately hardens into a package body 430 of the semiconductor package 400. As seen in FIGS. 3B, 3C and 3D, the package body 430 defines a generally planar top surface, a generally planar bottom surface, and a side surface which extends generally perpendicularly between the top and bottom surfaces. The side surface of the package body 430 defines four generally planar side surface sections, and four generally planar corner sections which extend diagonally between respective adjacent pairs of the side surface sections.

The package body 430 of the semiconductor package 400 is formed such that the top surfaces of the second leads 140', in addition to extending in co-planar relation to each other, extend in substantially flush, co-planar relation to the top surface of the package body 430. However, the top surfaces of the first leads 130', including the wire bonding areas 132' defined thereby, are completely covered by the package body 430 since the top surfaces of the first leads 130' are recessed relative to the top surfaces of the second leads 140'. The package body 430 is also formed such that the bottom surface of the die pad 110', the bottom surfaces of the tie bars 120', and the bottom surfaces of the first leads 130', in addition to extending in generally co-planar relation to each other, also extend in substantially flush, co-planar relation to the bottom surface of the package body 430. Thus, whereas the top surfaces of the second leads 140' are exposed in the top surface of the package body 430, the bottom surface of the die pad 110', the bottom surfaces of the tie bars 120', and the bottom surfaces of the first leads 130' are exposed in the bottom surface of the package body 430. In addition to the foregoing, the package body 430 is applied to the leadframe 100' such that the outer ends of the first leads 130' and tie bars 120' formed as a result of the singulation or removal of the dambar from the remainder of the leadframe 100' are covered by the package body 430.

Importantly, the encapsulant material applied to the leadframe 100' and used to form the package body 430 covers the shelf 111' of the die pad 110', the shelves 121' of the tie bars 120', and the shelves 131' of the first leads 130'. The encapsulation of the shelves 111', 121', 131' by the package body 430 enhances the locking of the die pad 110', the tie bars 120', and the first leads 130' to the package body 430, leading to improve bonding therebetween. Further, the shelf 111' formed in the die pad 110' increases the distance that moisture must travel to reach the semiconductor die 410, in comparison to the length of the moisture path that would exist if the die pad 110' was not provided with the shelf 111'. Thus, the inclusion of the shelf 111' in the die pad 110', in addition to the increasing the mechanical locking strength between the die pad 110' and the package body 430, also assists in preventing the deterioration of the performance of the semiconductor package 400 as a result of moisture penetration.

The semiconductor package 400 further comprises a conductive EMI shielding layer 440 which is applied to a portion of the package body 430. More particularly, as seen in FIGS. 3A, 3B, 3C and 3D, the shielding layer 440 is formed on the top surface of the package body 430 and electrically connected to the second leads 140' which, as indicated above, each have top surfaces which are exposed in the top surface of the package body 430. By virtue of its electrical connection to the second leads 140', the shielding layer 440 is also electrically connected to the die pad 110' and tie bars 120' since, as also indicated above, the tie bars 120' and the second leads 140' are each integrally connected to the die pad 110'. The shielding layer 440 can be formed of a conductive material selected from silver (Ag), copper (Cu), aluminum (Al), nickel (Ni) and gold (Au).

It is contemplated that when the semiconductor package 400 is attached and electrically connected to an external electronic device (not shown), the die pad 110', the bottom surface of which is exposed in the bottom surface of the package body 430 as indicated above, will serve as a ground and itself be electrically connected to the grounds of the external electronic device. The tie bars 120' also serve as grounds since they are electrically connected to the die pad 110', and may each also be electrically connected to the grounds of the external electronic device. As will be recognized, the wires 420 used to facilitate the electrical connection of one or more of the terminals 411 of the semiconductor die 410 to the wire bonding area 112' of the die pad 110' provide a grounding function. The first leads 130' of the semiconductor package 400 are used for signal transmission and serve as signal input/output paths through which signals are transmitted between the semiconductor die 410 and the external electronic device.

In the semiconductor package 400, the electrical connection of the shielding layer 440 to the die pad 110' and the tie bars 120' via the second leads 140' enables the formation of a ground pattern over the entire region of the semiconductor package 400. The ground pattern can shield electromagnetic interference (EMI) from the inside or outside of the semiconductor die 410. Thus, the shielding layer 440 is useful for the formation of a ground pattern effectively capable of shielding electromagnetic interference from the inside or outside of the semiconductor die 410 in the semiconductor package 400. Stated another way, the use of the ground pattern provided by the inclusion of the second leads 140' (which are comparatively thicker than the first leads 130') in the semiconductor package 400 increases the shielding efficiency of the semiconductor package 400 against electromagnetic interference from the inside or outside of the semiconductor die 410. Though not shown, the method for fabricating the semiconductor package 400 is substantially similar to that described above in relation to the semiconductor package 200.

Figure 4A:
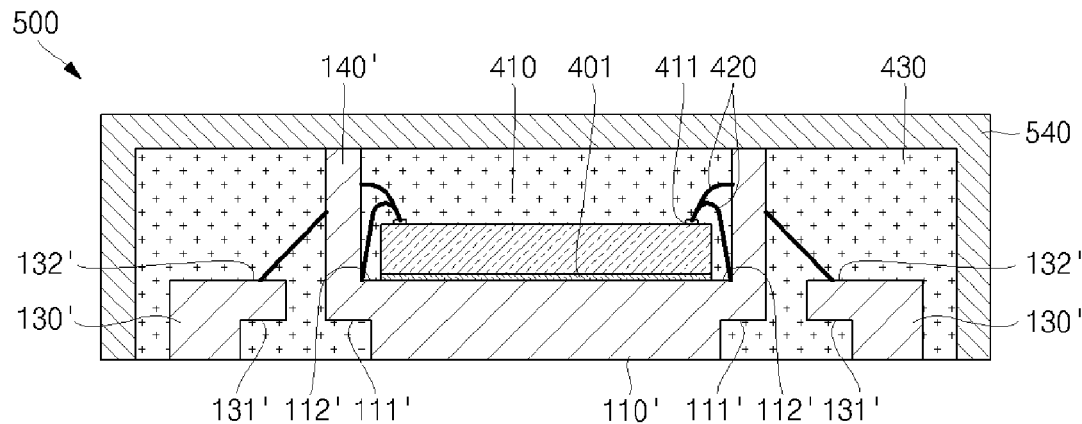
FIG. 4A is a cross-sectional view similar to FIG. 3C, but depicting a semiconductor package constructed in accordance with a fourth embodiment of the present invention as a variant of the semiconductor package of the third embodiment.
Figure 4B:
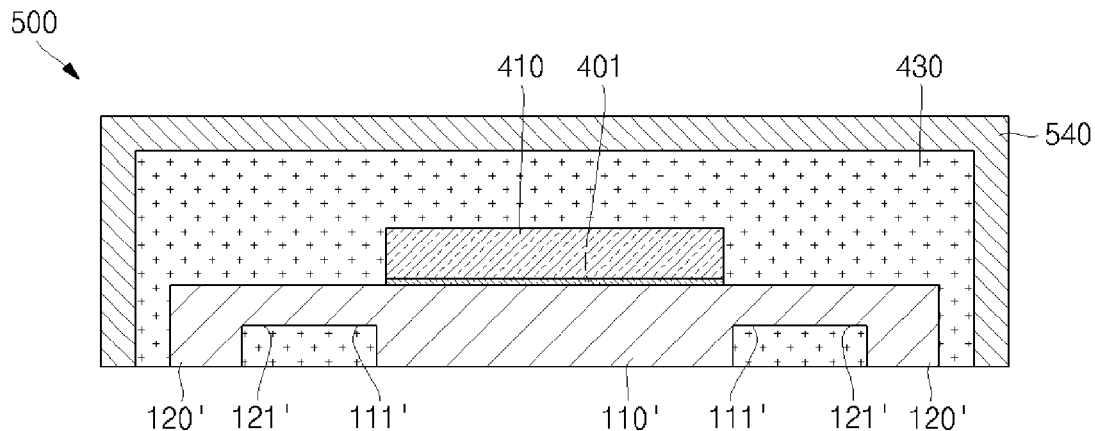
FIG. 4B is a cross-sectional view similar to FIG. 3D, but depicting the semiconductor package constructed in accordance with the fourth embodiment of the present invention.

Referring now to FIGS. 4A and 4B, there is shown a semiconductor device or package 500 constructed in accordance with a fourth embodiment of the present invention. The semiconductor package 500 bears a high level of structural similarity to the above-described semiconductor package 400, with only the distinctions between the semiconductor packages 500, 400 being described below.

The sole distinction between the semiconductor packages 500, 400 lies in the shape of the shielding layer 540 included in the semiconductor package 500 in comparison to the shielding layer 440 included in the semiconductor package 400. More particularly, in the semiconductor package 500, the conductive EMI shielding layer 540 is formed to cover the entirety of the top surface and the side surface of the package body 430, including the four (4) side surface sections and four (4) intervening corner sections defined by the side surface of the package body 430. As a result of its shape, the shielding layer 540 has a greater area than the above-described shielding layer 440, which enables the formation of a larger ground pattern over the entire region of the semiconductor package 500 in comparison to the ground pattern formed in the semiconductor package 400. Therefore, the shielding layer 540 can shield electromagnetic interference from the inside or outside of the semiconductor die 410 included in the semiconductor package 500 in a more stable and effective manner than the conductive EMI shielding layer 440 described above.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package, comprising:
   a die pad;
   a plurality of first leads extending at least partially about the die pad in spaced relation thereto;
   a semiconductor die attached to the die pad and electrically connected to at least some of the first leads;
   at least one second lead electrically connected to the die pad;
   a package body covering at least portions of the semiconductor die, the die pad and the first and second leads, the package body being formed such that each of the first leads and the second lead include at least one portion which is exposed therein; and
   a shielding layer which is disposed on at least a portion of the package body and is electrically connected to the portion of the second lead which is exposed in the package body.

2. The semiconductor package of claim 1 wherein:
   the package body has a top surface, a bottom surface, and a side surface which extends between the top and bottom surfaces, and is formed such that each of the first and second leads include a portion which is exposed in the bottom surface, and the second lead further includes a portion which is exposed in the top surface; and
   the shielding layer is formed to cover the top surface of the package body.

3. The semiconductor package of claim 1 wherein:
   the package body has a top surface, a bottom surface, and a side surface which extends between the top and bottom surfaces, and is formed such that each of the first and second leads includes portion which is exposed in the bottom surface, and the second lead further includes a portion which is exposed in the top surface; and
   the shielding layer is formed to cover the top and side surfaces of the package body.

4. The semiconductor package of claim 1 further comprising:
   at least one tie bar electrically connected to the die pad;
   the package body being formed such that the tie bar includes at least one portion which is exposed therein.

5. The semiconductor package of claim 4 wherein:
   the package body has a top surface, a bottom surface, and a side surface which extends between the top and bottom surfaces, and is formed such that each of the first leads and the tie bar include a portion which is exposed in the bottom surface, and the second lead includes a portion which is exposed in the top surface; and
   the shielding layer is formed to cover the top, surface of the package body and is electrically connected to the portion of the second lead exposed therein.

6. The semiconductor package of claim 5 wherein the shielding layer is formed to cover the top and side surfaces of the package body.

7. The semiconductor package of claim 5 wherein:
   the die pad defines a generally planar top surface, and a bottom surface which is disposed in opposed relation to the top surface and exposed in the bottom surface of the package body; and
   the second lead is attached and extends generally perpendicularly relative to the top surface of the die pad.

8. The semiconductor package of claim 1 further comprising:
   at least one tie bar electrically connected to the die pad;
   the package body being formed such that the tie bar includes at least one portion which is exposed therein, with the shielding layer further being electrically connected to the portion of the tie bar which is exposed in the package body.

9. The semiconductor package of claim 8 wherein:
   the package body has a top surface, a bottom surface, and a side surface which extends between the top and bottom surfaces, and is formed such that each of the first and second leads and the tie bar include a portion which is exposed in the bottom surface, and the second lead and the tie bar each include a portion which is exposed in the top surface; and
   the shielding layer is formed to cover the top surface of the package body and is electrically connected to the portions of the second lead and tie bar exposed therein.

10. The semiconductor package of wherein the shielding layer is formed to cover the top and side surfaces of the package body.

11. The semiconductor package of claim 9 wherein the die pad defines a top surface having the semiconductor die attached thereto, and a bottom surface which is disposed in opposed relation to the top surface and exposed in the bottom surface of the package body.

12. The semiconductor package of claim 11 wherein the first and second leads and the tie bar each further include an outer end which is exposed in the side surface of the package body.

13. The semiconductor package of claim 11 wherein the top surface of the package body and the portions of the tie bar and the second lead exposed therein extend in flush, generally co-planar relation to each other.

14. The semiconductor package of claim 13 wherein the bottom surface of the package body, the bottom surface of the die pad, and the portions of the first and second leads and the tie bar exposed in the bottom surface of the package body extend in flush, generally co-planar relation to each other.

15. The semiconductor package of claim 11 wherein the die pad, the first and second leads, and the tie bar each include a shelf which recessed relative to the portions thereof exposed in the bottom surface of the package body, the shelves each being covered by the package body.

16. The semiconductor package of claim 1 wherein the semiconductor die is electrically connected to the first leads by conductive wires which are covered by the package body.

17. The semiconductor package of claim 16 wherein the semiconductor die is electrically connected to a peripheral portion of the die pad which circumvents the semiconductor die by at least one conductive wire which is covered by the package body.

18. A semiconductor package, comprising:
- a die pad;
- a plurality of first leads extending at least partially about the die pad in spaced relation thereto;
- a semiconductor die attached to the die pad and electrically connected to at least some of the first leads;
- a plurality of second leads electrically connected to the die pad and protruding therefrom;
- a plurality of tie bars electrically connected to the die pad and protruding therefrom;
- a package body covering at least portions of the semiconductor die, the die pad, the tie bars, and the first and second leads, the package body being formed such that each of the tie bars and the first and second leads each include at least one portion which is exposed therein; and
- a shielding layer which is disposed on at least a portion of the package body and is electrically connected to portions of the second leads which are exposed in the package body.

19. The semiconductor package of claim 18 wherein the shielding layer is further electrically connected to portions of the tie bars which are exposed in the package body.

20. A semiconductor package, comprising:
- a die pad;
- a plurality of first leads disposed in spaced relation to the die pad;
- a semiconductor die attached to the die pad and electrically connected to at least some of the first leads;
- a plurality of second leads electrically connected to the die pad;
- a package body covering at least portions of the semiconductor die, the die pad and the first and second leads, the package body being formed such that each of the first and second leads include at least one portion which is exposed therein; and
- a shielding layer which is disposed on at least a portion of the package body and is electrically connected to a portion of each of the second leads which is exposed in the package body.

* * * * *

UNITED STATES PATENT AND TRADEMARK OFFICE
CERTIFICATE OF CORRECTION

| | |
|---|---|
| PATENT NO. | : 8,362,598 B2 |
| APPLICATION NO. | : 12/548354 |
| DATED | : January 29, 2013 |
| INVENTOR(S) | : Sung Sun Park et al. |

It is certified that error appears in the above-identified patent and that said Letters Patent is hereby corrected as shown below:

On the title page item [73] should be inserted as follows:
--Assignee: Amkor Technology, Inc., Chandler, AZ (US)--.

Signed and Sealed this
Twenty-ninth Day of October, 2013

Teresa Stanek Rea
*Deputy Director of the United States Patent and Trademark Office*